(12) United States Patent
Zhao et al.

(10) Patent No.: US 11,049,829 B2
(45) Date of Patent: *Jun. 29, 2021

(54) REDISTRIBUTION METAL AND UNDER BUMP METAL INTERCONNECT STRUCTURES AND METHOD

(71) Applicant: Avago Technologies International Sales Pte. Limited, Singapore (SG)

(72) Inventors: Sam Ziqun Zhao, Irvine, CA (US); Liming Tsau, Irvine, CA (US); Edward Law, Irvine, CA (US); Andy Brotman, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/700,528

(22) Filed: Dec. 2, 2019

(65) Prior Publication Data
US 2020/0105698 A1   Apr. 2, 2020

Related U.S. Application Data

(63) Continuation of application No. 15/792,922, filed on Oct. 25, 2017, now Pat. No. 10,504,862.

(51) Int. Cl.
*H01L 23/00* (2006.01)
*H01L 23/50* (2006.01)
*H01L 23/31* (2006.01)

(52) U.S. Cl.
CPC .......... *H01L 24/13* (2013.01); *H01L 23/3114* (2013.01); *H01L 23/3171* (2013.01); *H01L 23/50* (2013.01); *H01L 24/02* (2013.01); *H01L 24/05* (2013.01); *H01L 24/11* (2013.01); *H01L 24/03* (2013.01); *H01L 2224/023* (2013.01); *H01L 2224/0233* (2013.01);
(Continued)

(58) Field of Classification Search
CPC ..... H01L 24/13; H01L 24/19; H01L 24/3128; H01L 24/02; H01L 24/17; H01L 23/3128; H01L 2224/12105; H01L 2224/16227
See application file for complete search history.

(56) References Cited

U.S. PATENT DOCUMENTS 6,455,408 B1   9/2002   Hwang et al.
6,590,295 B1   7/2003   Liao et al.
(Continued)

OTHER PUBLICATIONS

Final Office Action on U.S. Appl. No. 15/792,922 dated Mar. 7, 2019.
(Continued)

*Primary Examiner* — Zandra V Smith
*Assistant Examiner* — John M Parker
(74) *Attorney, Agent, or Firm* — Foley & Lardner LLP

(57) ABSTRACT

An integrated circuit die includes a metal layer, a first passivation layer disposed above the metal layer, an aluminum containing redistribution layer disposed above the first passivation layer, an under bump metallization layer, and a redistribution layer plug. The redistribution layer plug is coupled to the metal layer and disposed in a via in the first passivation layer. The under bump metallization layer is coupled to the aluminum containing redistribution layer above the first passivation layer at a distance from the redistribution layer plug.

20 Claims, 3 Drawing Sheets

(52) U.S. Cl.
CPC ............... *H01L 2224/0235* (2013.01); *H01L 2224/0239* (2013.01); *H01L 2224/02351* (2013.01); *H01L 2224/0345* (2013.01); *H01L 2224/03462* (2013.01); *H01L 2224/03464* (2013.01); *H01L 2224/0401* (2013.01); *H01L 2224/05008* (2013.01); *H01L 2224/0509* (2013.01); *H01L 2224/05558* (2013.01); *H01L 2224/05559* (2013.01); *H01L 2224/05569* (2013.01); *H01L 2224/05624* (2013.01); *H01L 2224/13014* (2013.01); *H01L 2224/13022* (2013.01); *H01L 2224/13082* (2013.01); *H01L 2224/13099* (2013.01); *H01L 2924/01029* (2013.01); *H01L 2924/01074* (2013.01); *H01L 2924/14* (2013.01)

(56) References Cited

U.S. PATENT DOCUMENTS

| | | | |
|---|---|---|---|
| 7,498,251 B2 | 3/2009 | Lu | |
| 8,017,515 B2 | 9/2011 | Marimuthu et al. | |
| 8,058,735 B2 | 11/2011 | Lee et al. | |
| 2015/0064899 A1 | 3/2015 | Ji et al. | |
| 2015/0091161 A1* | 4/2015 | Tomita | H01L 23/562 257/737 |

OTHER PUBLICATIONS

Non-Final Office Action on U.S. 15/792,922 dated Aug. 31, 2018.
Notice of Allowance on U.S. Appl. No. 15/792,922 dated Aug. 7, 2019.

\* cited by examiner

REDISTRIBUTION METAL AND UNDER BUMP METAL INTERCONNECT STRUCTURES AND METHOD

CROSS-REFERENCE TO RELATED APPLICATION

This application is a continuation of U.S. patent application Ser. No. 15/792,922, filed Oct. 25, 2017, assigned to the assignee of this application, which is incorporated herein by reference in its entirety for all purposes.

BACKGROUND OF THE DISCLOSURE

One or more integrated circuits (ICs) are provided in a module or package. The IC is generally provided on a die that is connected by fine wires or by solder bumps to the package substrate or other die. The die often includes one or more under bump metallization (UBM) features that connect top metal layer features to the package substrate. A redistribution layer (RDL) is a metal layer on the die that makes the connection to at least one top metal layer feature available at other locations. The RDL layer can be used to facilitate or enable the connection of the top metal feature to the package substrate, other dies, other input/output (I/O) pads, other top metal features, etc.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Figure 1:
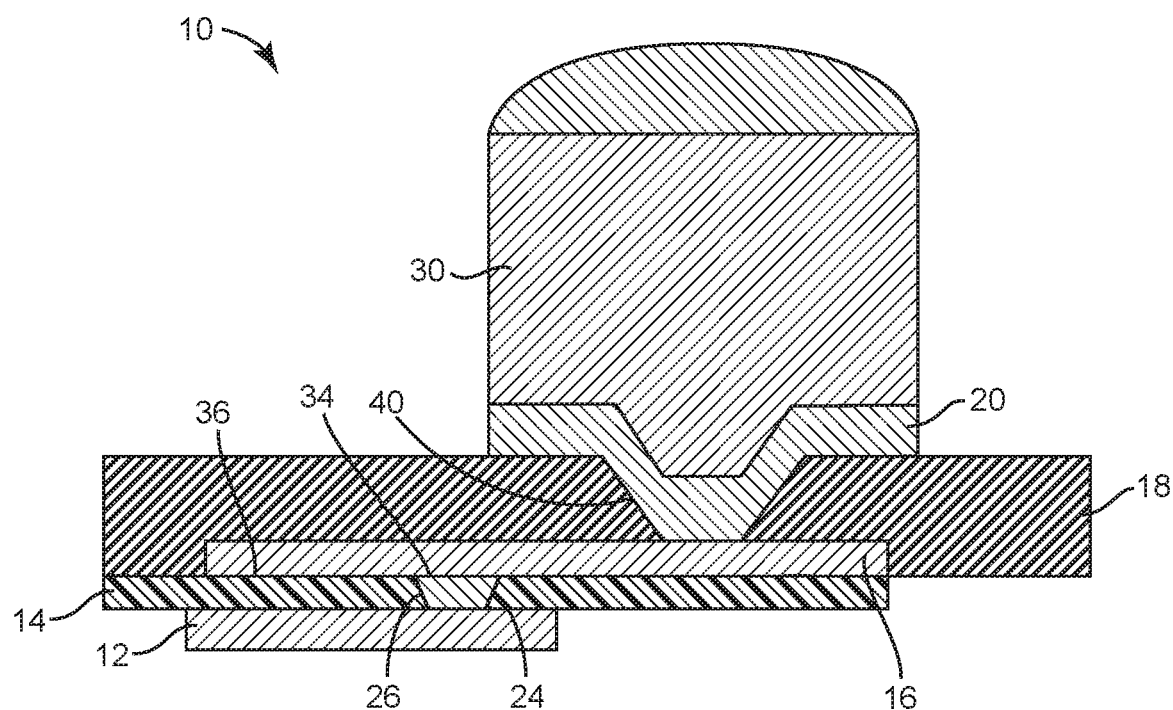
FIG. 1 is a cross sectional view schematic drawing of a portion of an IC die with an RDL via (RV) plug between an RDL and a metal layer according to some embodiments.

Before turning to the features, which illustrate some exemplary embodiments in detail, it should be understood that the application is not limited to the details or methodology set forth in the description or illustrated in the FIGs. It should also be understood that the terminology is for the purpose of description only and should not be regarded as limiting. Further, spatially relative terms, such as "top", "bottom", "beneath," "below," "lower," "above," "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Referring generally to the FIGs, an under bump metallization (UBM) feature is connected to a metal layer feature (e.g., top metal layer) by a via that does not require barrier material in some embodiments. The structures and methods for such a connection advantageously obtain finer line width and spacing by reducing the need for barrier material in the via in some embodiments. According to some embodiments, an RV is filled with an aluminum (Al) and a copper (Cu) plug or tungsten (Y) plug. The plug connects the top metal layer and the RDL which is coupled to the UBM feature in some embodiments. A top of the plug (and the bottom of the RDL layer) includes barrier material that is substantially planar to the to the RDL bottom surface in some embodiments.

According to some embodiments, the RDL is an Al—Cu alloy covered by a dielectric layer. According to some embodiments, a Cu UBM feature or a Cu plug is provided through a polyimide layer and separate from the UBM feature and connects an Al—Cu RDL layer and the top metal layer. In some embodiments, a UBM RDL is provided above the polyimide layer and is connected to a UBM feature coupled to the top metal layer.

In some embodiments, an Al—Cu or Cu plug is not used and disadvantages associated with the Al—Cu or Cu plug and barrier materials disposed within the via are avoided. Barrier materials include titanium, titanium nitride, tantalum or tantalum nitride, or mixtures, combinations or alloys thereof, and are used to prevent copper used in interconnect metallurgy from diffusing into surrounding dielectric materials such as silicon dioxide. In some embodiments, an Al—Cu alloy can be provided within the via between the UBM feature and a conductive barrier layer.

In some embodiments, an integrated circuit die includes a metal layer, a first passivation layer disposed above the metal layer, a redistribution layer disposed above the first passivation layer, an under bump metallization layer, and a redistribution layer plug. The redistribution layer plug is coupled to the metal layer and disposed in a via in the first passivation layer. A first surface of the redistribution layer plug is substantially in-plane with a second surface of the first passivation layer. The under bump metallization layer is coupled to the redistribution layer above the first passivation layer at a distance from the redistribution layer plug.

In some embodiments, an integrated circuit die includes a metal layer, a first passivation layer disposed above the metal layer, a conductive layer disposed above the passivation layer, a polyimide layer disposed above the conductive layer; and an under bump metallization layer. The under bump metallization layer is coupled to the metal layer through the polyimide layer, the conductive layer, and the first passivation layer.

In some embodiments, an integrated circuit die includes a metal layer, a barrier layer above the metal layer, a first passivation layer disposed above the barrier layer, a redistribution layer disposed above the first passivation layer, and a redistribution layer plug coupled to the metal layer and disposed in a via in the first passivation layer and barrier layer. A top surface of the redistribution layer plug is disposed above a top surface of the redistribution layer.

In some embodiments, an integrated circuit die includes a metal layer, a first passivation layer disposed above the metal layer, a first polyimide layer disposed above the first a passivation layer, and an under bump metallization layer coupled to the metal layer through the first polyimide layer. The under bump metallization layer includes at least one conductor extending across a top surface of the first polyimide layer and away from an area for a solder bump or pillar for the IC die.

With reference to FIG. 1, a portion of an IC die 10 includes a conductive layer 12 (e.g., a top metal layer), a dielectric layer 14, a redistribution layer (RDL) 16, a dielectric layer 18, an under bump metallization layer 20, and a bump structure 30. The conductive layer 12 is disposed at or near a top portion of the IC die 10 and provides a pad or feature for connection to external structures to the IC die 10, such as, connections using the redistribution layer 16, under bump metallization layer 20 and bump structure 30. In some embodiments, the dielectric layer 14 includes a via 24 which is filled with a plug 26 (e.g., an RV plug). A top surface 34 of the plug 26 is substantially in plane with a bottom surface 36 of the redistribution layer 16.

The conductive layer 12 can include a copper pad connected to one or more conductors of the conductive layer 12. In some embodiments, a barrier layer or liner layer is provided on the sides and bottom of the copper pad and conductors associated with the conductive layer 12. The conductive layer 12 is provided above a top interlayer dielectric layer (IDL) for the IC die 10 (e.g., deposited or grown and selectively etched according to various metal conductor IC formation techniques) in some embodiments. The IDL can be silicon dioxide deposited by a tetraorthoethylsilicate (TEOS) technique or other suitable insulative material deposition technique. The conductive layer 12 is a conductive material, such as Cu, Al—Cu or other metal or alloy and is approximately 0.2-2.0 micrometers (e.g., 3700-12500 Angstroms (A)) thick in some embodiments. The conductive layer 12 is an alloy of conductive materials including aluminum, copper, titanium, gold, etc. in some embodiments.

The dielectric layer 14 is a capping barrier dielectric layer (CBD) in some embodiments. The dielectric layer 14 is a silicon nitride, silicon oxynitride, or other barrier layer. The dielectric layer 14 can be deposited by plasma-enhanced chemical vapor deposition, and has a thickness of approximately 300-4900 angstroms. A planarization layer is provided above or as part of the dielectric layer 14 in some embodiments. In some embodiments, the passivation layer includes silicon dioxide, silicon nitride, silicon oxynitride, or combinations thereof, and is planarized by chemical mechanical polishing (CMP).

The via 24 in the dielectric layer 14 is provided through the dielectric layer 14 by selective etching (e.g., a photoresist etching process) in some embodiments. In some embodiments, dry etching selective to the material of dielectric layer 14 with respect to the material of the conductive layer 12 is used. The via 24 has a circular shape with a diameter of 0.2 micrometers or a square shape with a side of 0.2 micrometers. Other sizes and shapes can be chosen based upon electrical parameters for the connection to the bump structure 30 and process capabilities.

The redistribution layer 16 is an alloy of aluminum, titanium, an Al—Cu alloy, copper, gold, or other conductive material. Thin film deposition involving chemical vapor deposition (CVD), physical vapor deposition (PVD), or electrolytic plating, sputtering deposition, evaporation, and electroless plating processes can be utilized to form the redistribution layer 16. The redistribution layer 16 can be 2 to 20 (e.g., 28000 A) microns thick and deposited in a metal deposition technique and selectively etched to form conductors above the dielectric layer 14. The redistribution layer 16 includes an aluminum pad or conductor connected to the plug 26 in the via 24. The conductors are used to provide features, pads, or other conductive regions for providing connections to the conductive layer 12.

The plug 26 is a conductive material including copper material or including barrier metal materials (e.g., titanium, tantalum, tungsten, etc.) preventing diffusion of materials between the redistribution layer 16 and the top conductive layer 12 in some embodiments. The top surface 34 of the plug 26 is substantially planer to a bottom surface 36 of the redistribution layer 16. The plug 26 extends from the redistribution layer 16 to the top conductive layer 12. The plug 26 can be formed during fabrication of the IC die 10 before post-fabrication processes in some embodiments. In some embodiments, the plug 26 is formed in post-fabrication processes when subsequent layers are provided to the IC die 10. The pug 26 is entirely copper material or an alloy thereof in some embodiments from a top surface to a bottom surface. The sidewall of the via 26 is in contact with the copper material of the plug 26 in some embodiment. In some embodiments, the conductive layer 16 is an aluminum material and barrier material is not used above the layer 14.

Advantageously, the material of redistribution layer 16 is not provided within the via 24 and the redistribution layer 16 is substantially planer, thereby enabling finer line width and spacing due to uniformity in the thickness of the redistribution layer 16. Further, a single passivation layer and a single dielectric layer 18 is used in some embodiments. The top of the plug 26 is a barrier material (e.g., titanium, tantalum, tungsten, etc.). The top of the plug 26 has a top surface that is substantially planar with a layer of the barrier material above the redistribution layer 16 in some embodiments. In some embodiments, the via 24 filled with copper and planarized before 16 is deposited. The barrier material can be planarized and etched according to the shape of the redistribution layer 16 in some embodiments.

The dielectric layer 18 is a polyimide material in some embodiments. The dielectric layer 18 includes unmodified polyimides as well as modified polyimides such as polyester-imides, polyimide-imide-esters, polyimide-imides, polysiloxane-imides, and mixtures of polyimides. In some embodiments, the dielectric layer 18 is photosensitive low curing temperature dielectric resist, photosensitive composite resist, laminate compound film, solder mask resist film, liquid molding compound, $SiO_2$, $Si_3N_4$, SiON, $Al_2O_3$, polyimide, or other material having similar insulating and structural properties in some embodiments. The dielectric layer 18 can be deposited over dielectric layer 14 and redistribution layer 16, such as by coating, with a polyimide precursor and converting to cured polyimide by heating. The dielectric layer 18 is from about 0.3 to about 5.0 microns thick in some embodiments.

In some embodiments, the plug 26 is spaced apart by a distance from a via 40. The distance can be lateral appropriate spacing from the contact of under bump metallization layer 20. The spacing can be from 10 A to microns or more in some embodiments. The redistribution layer 16 allows the features associated with conductive layer 12 to be located at locations other than directly under the under bump metallization layer 20.

The via 40 is provided in the dielectric layer 18 for connecting the under bump metallization layer 20 to the redistribution layer 16. The dielectric layer 18 is selectively etched to form the via 40. The under bump metallization layer 20 can include titanium, nitride, copper, gold, titanium tungsten, or chromium, which can be deposited according to a metallization technique. In some embodiments, under bump metallization layer 20 can include a combination of materials such as those used in pad-limiting metallurgy. The under bump metallization layer 20 can be approximately 100-20,000 angstroms thick.

The bump structure 30 can be a conductive structure connected directly to the under bump metallization layer 20. The bump structure 30 can be a copper column, or copper, silver and tin solder material for making interconnections to package substrates. The bump structure 30 can have a variety of shapes including cylindrical, spherical, etc.

Figure 2:
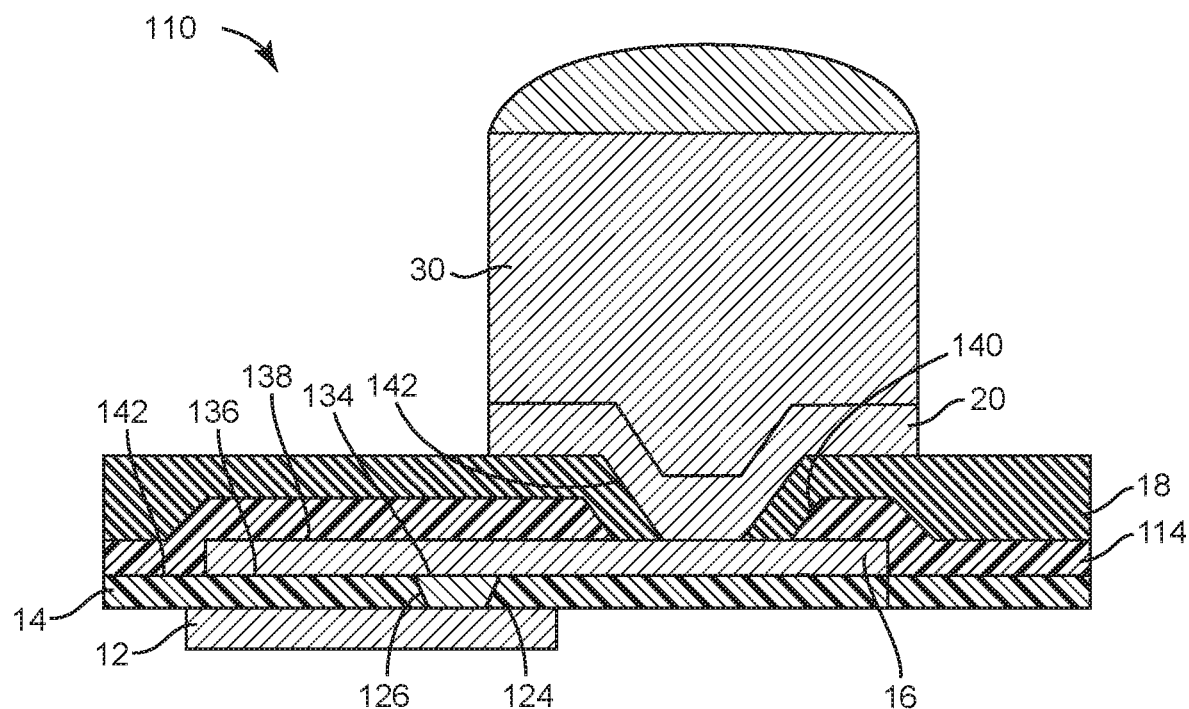
FIG. 2 is a cross sectional view schematic drawing of a portion of an IC die with an RV plug between an RDL and a metal layer according to some embodiments.

With reference to FIG. 2, a portion of an IC die 110 is similar to the IC die 10 described above with reference to FIG. 1. The IC die 110 includes a dielectric layer 114 provided above the dielectric layer 14 and the redistribution layer 16. The dielectric layer 114 can be a second capping barrier dielectric layer of similar material and thickness to the dielectric layer 14. A via 124 through the dielectric layer 14 is filled with a plug 126 for connecting the conductive layer 12 to the redistribution layer 16. The plug 126 connects the redistribution layer 16 to the top of the conductive layer 12. The redistribution layer 16 has a substantially planar top surface 138 and bottom surface 136. The plug 126 has a top surface 134 substantially co-planar with the bottom surface 136 of the redistribution layer 16 in some embodiments.

The plug 126 is comprised of a chemically mechanically polished (CMP) conductive material in some embodiments. The conductive material is tungsten, titanium, titanium nitride, titanium tungsten, nickel silicide, etc. in some embodiments. The plug 126 can be provided during fabrication of the IC die 110 or in a post-fabrication process. Advantageously, material associated with the redistribution layer 16 is not provided in the via 124 between the redistribution layer 16 and the conductive layer 12, thereby enabling finer line width and spacing due to uniformity in the thickness of the redistribution layer 16.

After the plug 126 is formed (e.g., by a deposition and etch back process), the dielectric layer 114 is deposited above the dielectric layers 14 and the redistribution layer 16. The dielectric layer 114 is etched to provide a via 140 in some embodiments. After the dielectric layer 18 is provided, a via 142 is provided in the dielectric layer 18 by selective etching. The via 140 is larger than the via 142 in some embodiments. The under bump metallization layer 20 is provided in the via 142 in some embodiments. The via 142 is similar to the via 42 (FIG. 1)

Figure 3:
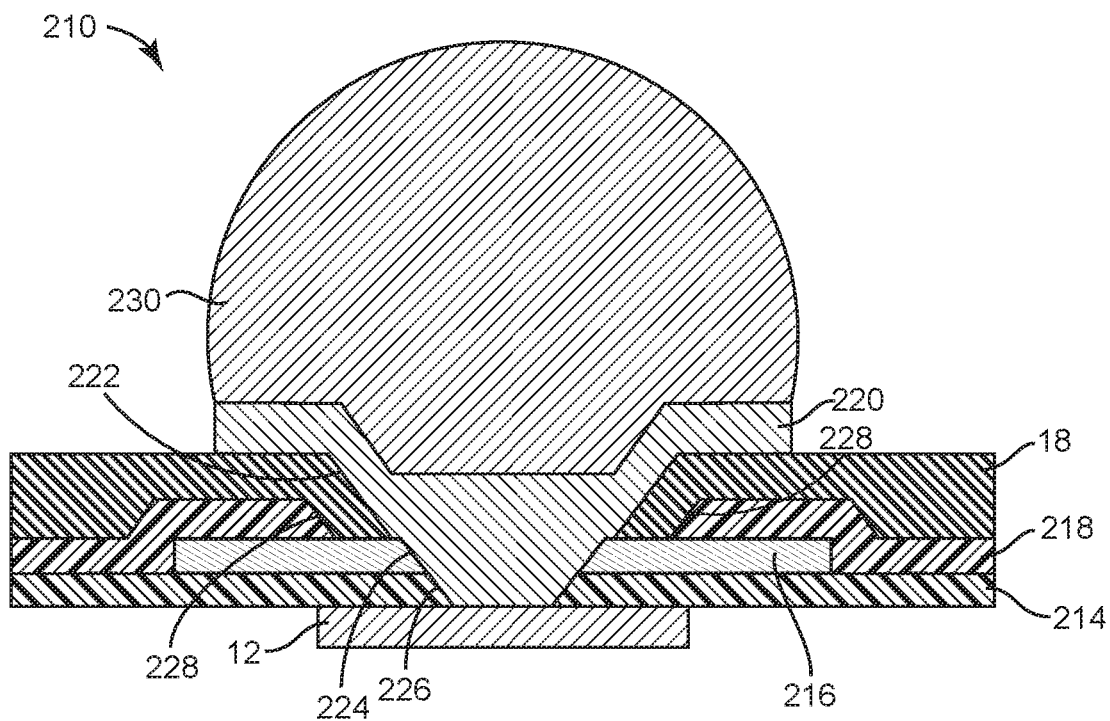
FIG. 3 is a cross sectional view schematic drawing of a portion of an IC die with an under bump metallization (UBM) layer connected to a top metal layer through an RDL according to some embodiments.

With reference to FIG. 3, a portion of an IC die 210 is similar to the IC dies 10 and 110 discussed above with respect to FIGS. 1 and 2. The IC die 210 includes the conductive layer 12 (e.g., a top metal layer) connected through an under bump metallization layer 220 to bump structure 230. In some embodiments, the bump structure 230 is a solder ball or solder pillar and is similar to the bump structure 30 discussed above. The under bump metallization layer 220 extends through a via 222 in the dielectric layer 18, a via 224 in a redistribution layer 216 and a via 226 in a dielectric layer 214 in some embodiments.

The redistribution layer 216 is an aluminum pad layer in some embodiments. A feature associated with the redistribution layer 216 is provided directly below the bump structure 230 and the under bump metallization layer 220. The redistribution layer 216 is similar to the redistribution layer 16 discussed above in some embodiments. In some embodiments, the redistribution layer is Cu or Al—Cu alloy.

The dielectric layer 214 is similar to the dielectric layers 14 and 114 discussed above in some embodiments. The dielectric layer 218 is similar to the dielectric layer 214 and is provided above the dielectric layer 214 and the redistribution layer 216. The under bump metallization layer 220 is provided after the vias 222, 224, and 226 have been formed. The under bump metallization layer 220 contacts the conductive layer 12 as well as the redistribution layer 216 in some embodiments. The redistribution layer 216 can extend across the IC die 210 to provide other connections, and yet does not have any physical contact with the conductive layer 12 due to the dielectric layer 214.

In some embodiments, the dielectric layer 218 is selectively etched to form via 228 and expose the redistribution layer 216. After the via 228 is formed, the dielectric layer 218 is deposited and selectively etched to form the via 222 and expose the redistribution layer 216.

In some embodiments, one mask is used on the redistribution layer 216 to form the vias 224 and 226 by etching. The via 224 has a smaller diameter than via 226. Dry etching can be used to etch through redistribution layer 216 (e.g., with an etch selective to the material of the redistribution layer 216) followed by an etch of the dielectric layer 214 (e.g., with an etch selective to the material of the dielectric layer 214).

There is no aluminum provided on the wall of the dielectric layer 214 in some embodiments. In some embodiments, the via 222 is etched in a process selective to the material of dielectric layer 18. IC die 210 advantageously provides a copper interconnect (using the under bump metallization layer 220) between the bump structure and the and conductive layer 12 without requiring an aluminum plug in vias 222, 224, and 226, thereby enabling higher DC current. The under bump metallization layer 220 contacts aluminum side walls in the via 224 associated with the redistribution layer 216.

The process can be provided in a post-fabrication bump formation process in some embodiment. The conductive layer 12 is protected by the dielectric layer 214 and the redistribution layer 216. In some embodiments, the redistribution layer 216 can be provided as a post-fabrication redistribution layer 216 combined with post-fabrication formation of the bump structure 30 for cost savings.

Figure 4:
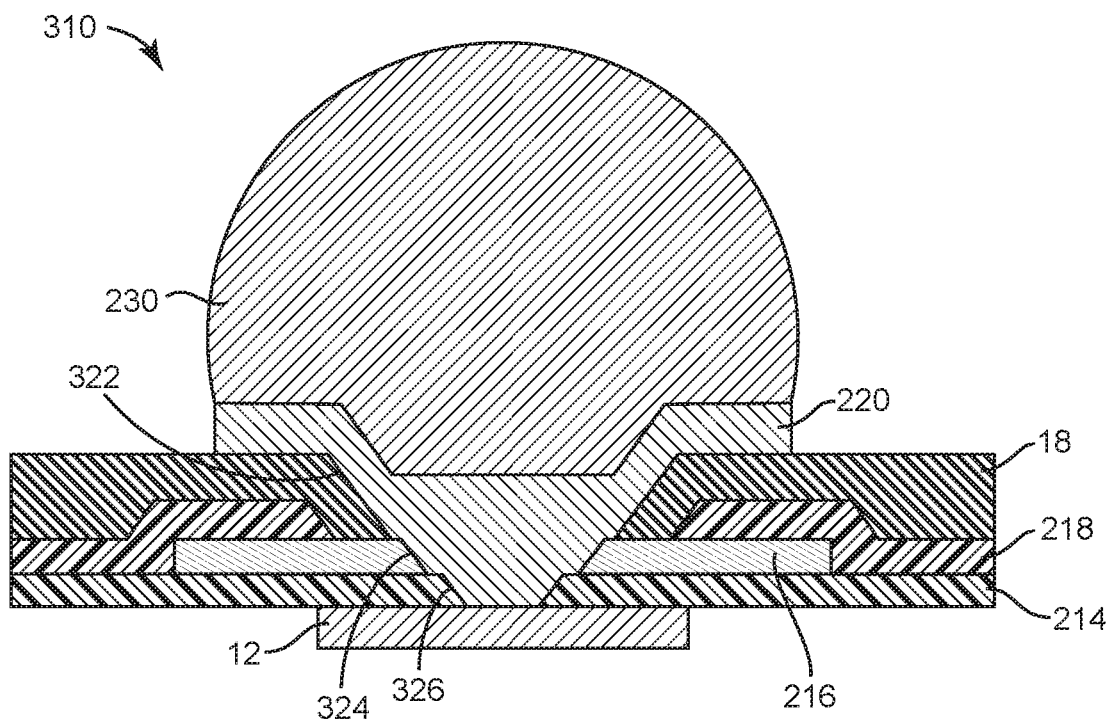
FIG. 4 is a cross sectional view schematic drawing of a portion of an IC die with an under bump metallization (UBM) layer connected to a top metal layer through an RDL according to some embodiments.

With reference to FIG. 4, an IC die 310 similar to the IC die 210 utilizes different size vias 322, 324, and 326 compared to vias 222, 224, and 226 (FIG. 3) in some embodiments. The vias 322 and 326 are selectively formed to have different sizes rather than a continuous side wall associated with the vias 224 and 226 (FIG. 3).

Figure 5:
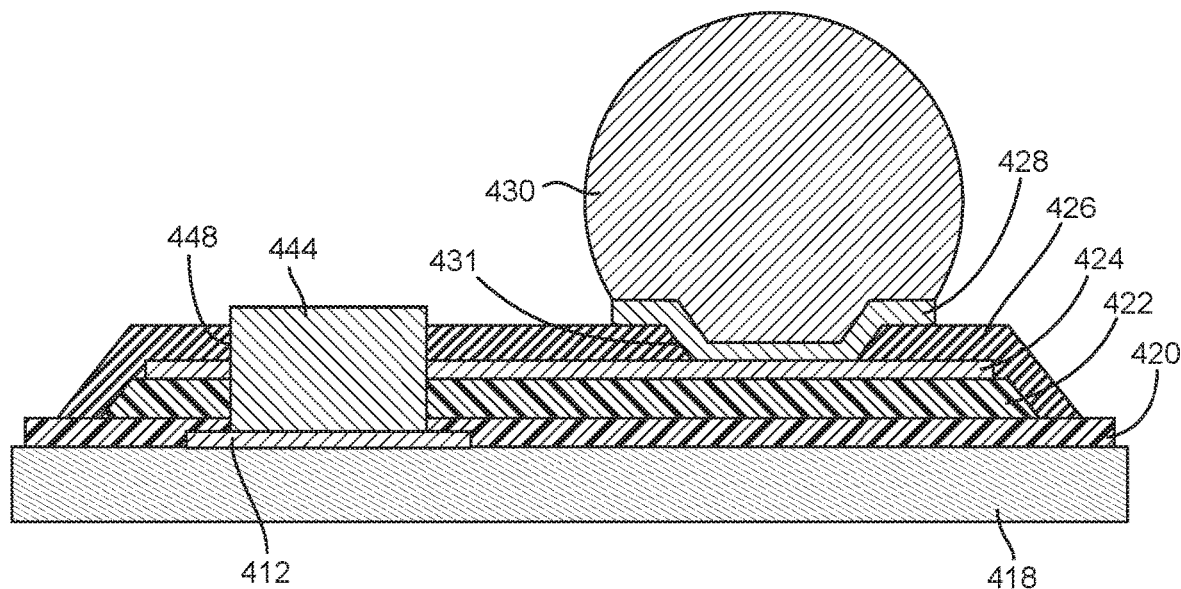
FIG. 5 is a cross sectional view schematic drawing of a portion of an IC die with an under bump metallization (UBM) layer RV plug connected to a top metal layer according to some embodiments.

With reference to FIG. 5, an IC die 410 includes a conductive layer 412, (e.g., a metal layer) similar to the conductive layer 12 (FIG. 1), a dielectric layer 418 disposed below the conductive layer 412, and a barrier layer 420 disposed above the conductive layer 412 and the dielectric layer 418. The IC die 410 also includes a dielectric layer 422, a redistribution layer 424, a dielectric layer 426, an under bump metallization layer 428, and a bump structure 430.

The dielectric layer 418 is an IDL in some embodiments. The barrier layer 420 is a capping barrier layer, such as, a silicon nitride layer, similar to the dielectric layer 14 (FIG. 1) in some embodiments. The under bump metallization layer 428 is coupled through a via 431 to the redistribution layer 424. The redistribution layer 424 is coupled to an under bump metallization plug 444 which is coupled to the conductive layer 412. The redistribution layer 424 is similar to the redistribution layer 16 and provided at least partially directly below the bump structure 430.

The dielectric layer 422 is a polyimide layer similar to the dielectric layer 18 (FIG. 1). The under bump metallization layer 428 is a under bump metallization layer similar to the under bump metallization layer 20 (FIG. 1) and is coupled to the redistribution layer 424 through the via 430.

A via 448 is provided through the layers 426, 424, 422, and 420 by selective etching until the conductive layer 416 is reached. The under bump metallization plug 444 provides contact to the redistribution layer 424 at its side walls. The plug 444 can be formed when the under bump metallization layer 428 is formed in a post IC fabrication process in some embodiments. The plug 444 is formed in a conformal deposition and etch back process and is the same material as the under bump metallization layer 428 in some embodiments. In some embodiments, the under bump metallization plug 444 has the same thickness as the under bump metallization layer 428.

Figure 6:
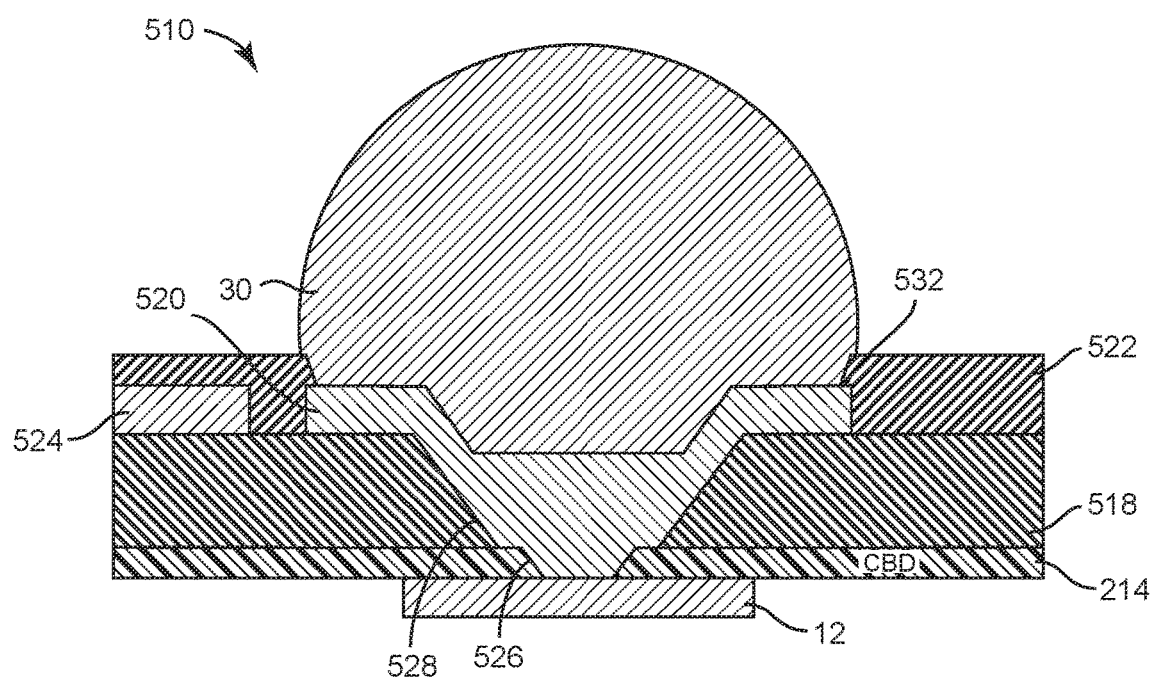
FIG. 6 is a cross sectional view schematic drawing a cross sectional view schematic drawing of a portion of an IC die with an under bump metallization (UBM) layer including an RDL portion according to some embodiments.

With reference to FIG. 6, a portion of an IC die 510 is similar to the IC die 210 except the redistribution layer 216 is not provided between the under bump metallization layer 120 and the conductive layer 12 (FIG. 3). The IC die 510 includes the conductive layer 12 (e.g., a top metal layer), the dielectric layer 214, the under bump metallization layer 520, the bump structure 30, a dielectric layer 518, and a dielectric layer 522. The dielectric layers 518 and 522 are two separate polyimide layers similar to the dielectric layer 18 discussed above with respect to FIG. 1.

The dielectric layer 522 is provided above the dielectric layer 518 and the under bump metallization layer 520 is provided above the dielectric layer 518. The dielectric layer 518 is 0.2 to about 2.5 microns thick and layer 522 is 0.2 to about 2.5 microns thick. The dielectric layer 518 includes a via 528, and the dielectric layer 214 includes a via 526. A via 532 is provided in the dielectric layer 522 in some embodiments. The vias 526 and 528 is formed by selective etching to reach the conductive layer 12.

A redistribution layer 524 is provided above the dielectric layer 518. After the layer 518 is formed and the vias 526 and 528 are provided, the under bump metallization layer 520 is deposited above the layer 518 and within the vias 526 and 528. The under bump metallization layer 520 is selectively etched to leave the redistribution layer 524 and the under bump metallization layer 520 in the vias 526 and 528. The under bump metallization layer 520 and the redistribution layer 524 are structures from the same layer in some embodiments. The under bump metallization layer 520 and the redistribution layer 524 are the same material (e.g., copper material or copper alloy) in some embodiments. In some embodiments, nickel, gold, combinations thereof or other conductive materials can be provided as the under bump metallization layer 520 and the redistribution layer 524. Advantageously, the redistribution layer 524 is provided when the under bump metallization layer 520 is provided after the layer 518 is provided.

The dielectric layer 522 is deposited after the under bump metallization layer 520 and is selectively etched to form the via 532 and expose the under bump metallization layer 520 as defined by a mask at the location of the via 532 in some embodiments. The dielectric layer 522 is etched to reveal the under bump metallization layer 520 for attachment of the bump structure 30. In some embodiments, the dielectric layer 522 is provided after the bump structure 30 is formed. Advantageously, a separate redistribution layer 16 as shown in FIG. 1, and an aluminum plug is not required and a second capping barrier layer is not required. The redistribution layer 524 extends and connects with the under bump metallization layer 520 or for connection to other elements. In some embodiments, the redistribution layer 524 is not covered by the dielectric layer 522.

The disclosure is described above with reference to drawings. These drawings illustrate certain details of specific embodiments that implement the systems and methods and programs of the present disclosure. However, describing the disclosure with drawings should not be construed as imposing on the disclosure any limitations that are present in the drawings. The embodiments of the present disclosure can be implemented using various types of dies. No claim element herein is to be construed as a "means plus function" element unless the element is expressly recited using the phrase "means for." Furthermore, no element, component or method step in the present disclosure is intended to be dedicated to the public, regardless of whether the element, component or method step is explicitly recited in the claims.

It should be noted that certain passages of this disclosure can reference terms such as "first" and "second" in connection with devices for purposes of identifying or differentiating one from another or from others. These terms are not intended to relate entities or operations (e.g., a first region and a second region) temporally or according to a sequence, although in some cases, these entities can include such a relationship. Nor do these terms limit the number of possible entities or operations.

It should be understood that the circuits described above can provide multiple ones of any or each of those components. In addition, the structures, circuits and methods described above can be adjusted for various system parameters and design criteria, such as shape, depth, width, thicknesses, material, etc. Although shown in the drawings with certain components directly coupled to each other, direct coupling is not shown in a limiting fashion and is exemplarily shown. Alternative embodiments include circuits with indirect coupling between the components shown.

It should be noted that although steps are described in an order, it is understood that the order of these steps can differ from what is depicted. Also two or more steps can be performed concurrently or with partial concurrence. Such variation will depend on the software and hardware systems chosen and on designer choice. It is understood that all such variations are within the scope of the disclosure.

While the foregoing written description of the methods and systems enables one of ordinary skill to make and use what is considered presently to be the best-mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. An integrated circuit die, comprising:
a metal layer;
a redistribution layer;

a dielectric layer disposed between the metal layer and the redistribution layer, the dielectric layer directly contacting a first portion of a first surface of the redistribution layer;

a redistribution layer plug disposed in a via through the dielectric layer, wherein a first surface of the redistribution layer plug is substantially in-plane with the first surface of the redistribution layer, and a second surface of the redistribution layer plug is substantially in-plane with a surface of the metal layer; and an under bump metallization layer coupled to a portion of a second surface of the redistribution layer, the portion of the second surface of the redistribution layer facing a second portion of the first surface of the redistribution layer, wherein the redistribution layer is not within the via.

2. The integrated circuit die of claim 1, wherein material of the redistribution layer is not within the via.

3. The integrated circuit die of claim 1, wherein the redistribution layer plug comprises tungsten, titanium, titanium nitride, titanium-tungsten, or nickel silicide.

4. The integrated circuit die of claim 1, wherein the redistribution layer plug comprises copper.

5. The integrated circuit die of claim 4, wherein the first surface of the redistribution layer plug comprises tungsten, titanium, or tantalum.

6. The integrated circuit die of claim 1, wherein the under bump metallization layer is coupled to the redistribution layer through a polyimide layer, the redistribution layer comprising, copper, aluminum, gold, or any combination thereof.

7. An integrated circuit die, comprising:
a metal layer;
a polyimide layer;
a first dielectric layer disposed between the metal layer and the polyimide layer;
a conductive layer disposed between the first dielectric layer and the polyimide layer; and
an under bump metallization layer extended to the metal layer through the polyimide layer, the conductive layer, and the first dielectric layer in that sequence, wherein the under bump metallization layer directly contacts the metal layer and the conductive layer.

8. The integrated circuit die of claim 7, wherein the under bump metallization layer is provided through a first hole in the polyimide layer, a second hole in the conductive layer, and a third hole in the first dielectric layer, the first hole being larger than the second hole and the second hole being larger than the third hole.

9. The integrated circuit die of claim 7, wherein a surface of the conductive layer contacting the under bump metallization layer is substantially in-plane with a surface of the first dielectric layer contacting the under bump metallization layer.

10. The integrated circuit die of claim 7, further comprising a second dielectric layer, a first portion of the second dielectric layer between the first dielectric layer and the polyimide layer.

11. The integrated circuit die of claim 10, wherein a second portion of the second dielectric layer is between the conductive layer and the polyimide layer.

12. The integrated circuit die of claim 7, wherein the under bump metallization layer comprises copper.

13. An integrated circuit die, comprising:
a metal layer;
a dielectric layer;
a barrier layer disposed between the dielectric layer and the metal layer;
a redistribution layer, the barrier layer disposed between the redistribution layer and the metal layer, wherein the redistribution layer does not contact the metal layer; and
a first under bump metallization layer plug coupled to the metal layer and disposed in a via that is provided through the dielectric layer, the redistribution layer, and the barrier layer in that sequence, wherein the first under bump metallization layer plug protrudes above a surface of the dielectric layer.

14. The integrated circuit die of claim 13, further comprising:
a second under bump metallization layer contacting a first portion of the redistribution layer through the dielectric layer, the first portion of the redistribution layer offset from a second portion of the redistribution layer abutting the first under bump metallization layer.

15. The integrated circuit die of claim 14, wherein the first under bump metallization layer plug and the second under bump metallization layer comprise a same material.

16. The integrated circuit die of claim 14, wherein the second under bump metallization layer is coupled to a solder bump or pillar for the integrated circuit die.

17. An integrated circuit die, comprising:
a metal layer;
a first polyimide layer;
a dielectric layer disposed between the metal layer and the first polyimide layer; and
an under bump metallization layer comprising:
a first conductor coupled to the metal layer through the first polyimide layer and the dielectric layer in that sequence, and
a second conductor away from an area for a solder bump or pillar for the integrated circuit die, wherein the first conductor is directly connected between the solder bump or pillar and the metal layer, wherein the second conductor and the first conductor extend above the first polyimide layer and are separated by a portion of the first polyimide layer.

18. An integrated circuit die, comprising:
a metal layer;
a first polyimide layer;
a dielectric layer disposed between the metal layer and the first polyimide layer; and
an under bump metallization layer comprising:
a first conductor coupled to the metal layer through the first polyimide layer and the dielectric layer in that sequence, wherein the first conductor is directly connected between a solder bump or pillar and the metal layer; and
a second conductor disposed away from an area for the solder bump or pillar for the integrated circuit die, wherein the first conductor is directly connected between the solder bump or pillar and the metal layer; and
a second polyimide layer, the second polyimide layer being at least partially above the first conductor and the second conductor.

19. The integrated circuit die of claim 18, wherein an end of the first conductor is disposed between a portion of the first polyimide layer and a portion of the second polyimide layer.

20. The integrated circuit die of claim 19, wherein the portion of the second polyimide layer contacts the solder bump or pillar.

\* \* \* \* \*